United States Patent [19]

Portugall et al.

[11] Patent Number: 4,802,061
[45] Date of Patent: Jan. 31, 1989

[54] MICROELECTRONIC COMPONENTS AND THICK-FILM HYBRID CIRCUITS

[75] Inventors: Michael Portugall, Wachenheim; Hans-Josef Sterzel, Dannstadt-Schauernheim; Gerd Blinne, Bobenheim; Heinz-Dieter Vondenhagen, Frankenthal; Erhard Seiler, Ludwigshafen; Hans-Friedrich Schmidt, Eurasburg; Sybille Von Tomkewitsch, Pöcking, all of Fed. Rep. of Germany

[73] Assignee: BASF Aktiengesellschaft, Ludwigshafen, Fed. Rep. of Germany

[21] Appl. No.: 77,215

[22] Filed: Jul. 24, 1987

[30] Foreign Application Priority Data

Jul. 25, 1986 [DE] Fed. Rep. of Germany ....... 3625263

[51] Int. Cl.⁴ .................... H05K 1/18; B32B 27/36
[52] U.S. Cl. .................... 361/400; 428/480; 428/901; 524/604; 524/605
[58] Field of Search ............ 524/601, 604, 605; 361/400; 427/96; 428/901, 480; 156/902

[56] References Cited

U.S. PATENT DOCUMENTS

| | | | |
|---|---|---|---|
| 4,311,749 | 1/1982 | Hiraiwa et al. | 427/96 |
| 4,384,016 | 5/1983 | Ide et al. | 428/910 |
| 4,413,051 | 11/1983 | Thomas | 427/96 |
| 4,496,794 | 1/1985 | Darms et al. | 427/96 |
| 4,529,565 | 7/1985 | Kasatani et al. | 528/193 |
| 4,581,279 | 4/1986 | Sugishita et al. | 428/901 |
| 4,647,508 | 3/1987 | Gazit et al. | 428/901 |
| 4,717,624 | 1/1988 | Ikenaga et al. | 428/423.7 |

FOREIGN PATENT DOCUMENTS

| | | |
|---|---|---|
| 0139303 | 5/1985 | European Pat. Off. . |
| 0135310 | 3/1986 | European Pat. Off. . |
| 2520819 | 11/1975 | Fed. Rep. of Germany . |
| 1507207 | 4/1978 | United Kingdom . |
| 1508646 | 4/1978 | United Kingdom . |

OTHER PUBLICATIONS

Inzenhofer, "Dickschicht-Hybridschaltungen, neue Fertigungstechnik fur die Industrieelektronik", Technik Heute, 1985, pp. 24–32.

Mehrschichtenkeramik-Technologie fur das "Thermal Conduction Module", Berichte der deutschen keramischen Gesellschaft, Part 7, 1981, pp. 553–557.

A. G. Saunders, "Plastics in Integrated Circuit Packaging", Shell Polymers, vol. 9, Part 1, 1985, pp. 12–15.

*Primary Examiner*—Lewis T. Jacobs
*Attorney, Agent, or Firm*—Keil & Weinkauf

[57] ABSTRACT

In microelectronic components and thick-film hybrid circuits, the multilayer substrates of the said components and the substrates of the said circuits are produced using liquid crystalline polymers which can be processed by a thermoplastic method.

5 Claims, No Drawings

MICROELECTRONIC COMPONENTS AND THICK-FILM HYBRID CIRCUITS

The present invention relates to a microelectronic components and thick-film hybrid circuits which have a lower rate of transient errors and a higher signal velocity compared with the prior art and whose multilayer substrates or substrates are simple to produce and dimensionally stable.

Microelectronic components contain, as an essential component, a wafer which usually consists of silicon and on which the actual functional current circuits are mounted in a two-dimensional circuit system. The silicon chip is generally also referred to as an integrated circuit.

Current circuits of an integrated circuit which have different functions must always be connected to one another or integrated with one another in a suitable manner, which is often impossible in two dimensions. For this reason and for reasons of mechanical stability, and because it is necessary to connect the microscopically small end points of the conductor paths to those of other integrated circuits and/or circuits of larger dimensions, eg. thick-film hybrid circuits, the integrated circuit has to be mounted on a base which contains, in a suitable circuit arrangement, the conductor paths required for extension of the circuit and external connection. A base of this type is referred to as a substrate.

Because of the circuit density which has now been achieved in integrated circuits, one substrate is frequently insufficient; instead, a plurality of substrates placed in layers one on top of the other and wired to one another are necessary in order to fulfill the above-mentioned functions. These substrates are referred to as multilayer substrates.

These multilayer substrates in turn form part of the package for an integrated circuit. A package is a component which is shaped in a suitable manner and composed of different parts and whose object is to anchor the integrated circuit in three dimensions, to connect it to other integrated circuits and/or to very much larger circuit units, eg. thick-film hybrid circuits, and, if necessary, to shield it hermetically from environmental effects.

The combination of integrated circuit and package is referred to as a microelectronic component.

Thick-film hybrid circuits are electric components which essentially consist of a substrate, on which circuit paths are mounted in a suitable manner, and passive and active electric components, and which are protected from environmental effects by an outer covering (cf. A. Inzenhorfer, Fickschicht-Hydridschaltungen, neue Fertigungstechnik für die Industrieelektronik, Technik Heute, 1985, pages 24–32). Typical active electric components of thick-film hybrid circuits are the microelectronic components defined above.

In the prior art method, the multilayer substrates of the integrated circuits are produced using unsintered ceramic sheets about 200–400 μm thick. After the conductor paths have been applied by screen printing with metal pastes and the ceramic sheets have been stacked one on top of the other, they must be baked and sintered (cf. Mehrschichtenkeramik-Technologie für das Thermal Conduction Module, Berichte der deutschen keramischen Gesellschaft, Part 7, 1981, pages 553–557). However, this process is very expensive and very time consuming and entails a considerable rejection rate.

Furthermore, the high content of α-emitters in the ceramic materials causes transient errors in the integrated circuits. The α-particles which penetrate the semiconductor material produce electronhole pairs which recover only after a certain time and, until then, have a more or less serious adverse effect on the functioning of the integrated circuit. There has therefore been no lack of attempts to replace the ceramic materials in the package by thermoplastics or reactive resins, such as silicone resins or epoxy resins (cf. A. G. Saunders, Plastics in integrated circuit packaging, Shell Polymers, Volume 9, Part 1, 1985, pages 12–15). However, these generally have disadvantages, such as permeability to water and to gas. Furthermore, postcuring is necessary when reactive resins are used, whereas, when thermoplastics are used, the thermoplastic melt often causes bending or complete destruction of the fine connecting wire emanating from the integrated circuit during injection molding.

The same applies to thick-film hybrid circuits whose substrates are known to be produced using a ceramic or enameled steel (cf. A. Inzenhofer, Dickschicht-Hybridschaltungen, neue Fertigungstechnik für die Industrieelektronik, Technik Heute, 1985, pages 24–32). The production of such substrates is also very technically complicated and time-consuming, and the rate of transient errors in the thick-film hybrid circuits is high. Moreover, it has been impossible to date to replace the ceramic or steel substrates with those made of plastics, for example of epoxy resins, as usually employed for the production of conventional circuit boards.

Furthermore, EP-A-No. 135 310 discloses that microelectronic and electric components can be covered with liquid crystalline polymers which contain inorganic fillers and can be processed by a thermoplastic method.

It is an object of the present invention to provide microelectronic components and thick-film hybrid circuits which do not have the disadvantages described above and moreover have a higher signal velocity compared with the prior art and a lower rate of transient errors, the multilayer substrates of the microelectronic components and the substrates of the thick-film hybrid circuits being simple to produce and dimensionally stable.

We have found that this object is achieved by microelectronic components and thick-film hybrid circuits in which the multilayer substrates of the microelectronic components and the substrate of the thick-film hybrid circuits are produced using liquid crystalline polymers which can be processed by a thermoplastic method.

For the purpose of the present invention, the term liquid crystalline polymer which can be processed by a thermoplastic method means a polymer which, in the form of a melt, has anisotropic optical properties which can be detected with the aid of the thermooptic test described in columns 20 to 24 of German Published Application DAS No. 2,520,819, by polarization microscopy on very thin, molten polymer layers. Polymer melts having isotropic optical properties essentially produce extinction of the light used in the test when crossed polarizers are used, whereas optically anisotropic polymer melts exhibit birefringent textures which may be attributed to liquid crystalline phases.

Suitable liquid crystalline polymers to be used according to the invention for the production of multilayer substrates and of substrates and processable by a thermoplastic method form liquid crystalline phases below 400° C., preferably below 360° C. Liquid crystalline, fully or partially aromatic polycondensates which can be processed by a thermoplastic method are very suitable, the term fully aromatic expressing the fact that each monomer unit present in the polycondensate provides one or more aromatic rings for snythesizing the polymer chain; on the other hand, the term partially aromatic indicates that some of the monomer units present in the polycondensate are not aromatic groups but, for example, aliphatic or cycloaliphatic groups.

Such polycondensates can be prepared in a conventional manner from appropriate aromatic and, if required, aliphatic or cycloaliphatic compounds, each of which contains two or more functional groups capable of undergoing condensation reactions; in these compounds, these functional groups are always bonded to the basic skeletons of the compounds in such a way that substantially linear or nearly linear polycondensates are predominantly formed in the polycondensation reactions. Among these compounds, the aromatic ones are preferred.

Examples of suitable functional groups of preferred compounds, which groups are capable of undergoing condensation reactions, are hydroxyl, acyloxy, hydroxylate, thiolo, thiolate, amino and acylamino groups on the one hand and carboxyl, carboxyle, carboxylic anhydride, carboxlyic ester and carbonyl halide groups and halogen atoms on the other hand, which are capable of reacting with one another to form ester, thioester, carbonate, amide, imide, ether or thioether groups, functional groups which react with one another to form ester groups being preferred.

In addition to these functional groups, the compounds may contain groups which are incapable, or no longer capable, of undergoing the condensation reaction to be carried out in specific cases, e.g. halogen atoms or alkyl, alkylene, aryl, carbonyl, sulfonyl, ether, imide or pseudonhalide groups.

Examples of suitable basic skeletons of preferred compounds which contain condensable functional groups are mononuclear aromatics, such as benzene; linear polynuclear aromatics directly bonded to one another, such as biphenyl, terphenyl or quaterphenyl; linera kata-fused aromatics, such as naphthalene or anthracene, and linear polynuclear aromatics indirectly bonded to one another, such as diphenyl sulfone, diphenyl ehter, triphenyl ether, 2,2-diphenylpropane, diphenyl ketone, 1,2-bisphenoxyethane or anthraquinone.

Accordingly, examples of preferred aromatic compounds used in the preparation of the polycondensates are hydroquinone, 2,6-dihydroxynaphthalene, 2,7-dihydroxynaphthalene, 4,4'-dihydroxybiphenyl, bis-(4-hydroxyphenyl) sulfone, bis-(4-hydroxyphenyl) ketone, 2,2-bis-(4-hydroxyphenyl)-propane, bis-(4-hydroxyphenyl) ether, 1,2-bis-(4-hydroxyphenoxy)-ethane, 2,6-dihydroxyanthracene or 2,6-dihydroxyanthraquinone on the one hand and terephthalic acid and/or isophthalic acid and, if required, p-hydroxybenzoic acid on the other hand.

Consequently, the liquid crystalline polymers which are particularly suitable according to the invention and can be processed by a thermoplastic method are substantailly linear or nearly linear, fully aromatic polycondensates, such as polyesters, polyesteramides, polyesterethers, polyestercarbonates, polyesteramidoimides or polyesterimides, of which polyesters prepared from the preferred compounds are particularly preferably used.

Polyesters of this type and their preparation are disclosed in, for example, EP-A- No. 01 39 303.

The liquid crystalline polymers which can be processed by a thermoplastic method may contain suitable finely divided, homogeneously dispersed, inorganic fillers. Examples of suitable fillers are amorphous silica, powdered quartz, talc, alumina and cordierite. In general, these inorganic fillers have a mean particles size of from 0.5 to 50 $\mu$m, not less than 99% of the particles being smaller than 100 $\mu$m. Particularly suitable particles are those which are spherical or nearly spherical. The particles may be coated with conventional materials, for example $\gamma$-aminopropyltriethoxysilane or $\gamma$-glycidyloxypropltrimethoxysilane, in order to make it easier to disperse them in the liquid crystalline polymers. In general, these inorganic fillers can be present in the said polymers in an amount of frmo 10 to 70, preferably from 20 to 60, in particular form 30 to 55, % by weight, based on the polymers.

The liquid crystalline polymers may furthermore contain colorants, tackifiers, antioxidants, lubricants, mold release agents, plasticizers and other additives which, however, must not have an adverse effect on the performance characteristics of the polmers or on the functioning of the microelectronic components and the thick-film hybrid circuits.

For the production of the novel microelectronic components, multilayer substrates are first prepared using the liquid crystalline polymers which can be processed by a thermoplastic method.

The said liquid crystalline polymers are converted to 10–50 $\mu$m, preferably 20–40 $\mu$m, thick films by extrusion and downstream biaxial orientation or by extrusion and downstream film blowing, the stated methods being conventional polymer processing procedures which have no special features in terms of the method and whose process parameters can be determined by simple preliminary experiments.

Rectangular, preferably square, pieces of film having a suitable edge length, usually 5 cm, are punched out from the films of the said liquid crystalline polymers, these films having been produced in the above manner. By punching or by exposure to laser light, these pieces of film are provided with the holes required for subsqeuent three-dimensional connection, the hole diameter generally being about 150 $\mu$m. The conductor paths according to the circuit diagram are then applied by screen printing with metal pastes, for example with epoxy resins having a high content of silver powder. The holes are filled with the metal paste; these points are subsequently used for mutual electrical contact between the circuits on different pieces of film.

The pieces of film provided with the conductor paths and contact points and consisting of the said liquid crystalline polymers may also be regarded as single-layer substrates and are subsequently stacked one on top of the other in the sequence conforming to the three-dimensional circuit design, fixed exactly in this arrangement, for example in a frame, and then firmly bonded to one another under pressure and at elevated temperatures, preferably above the glass transition temperature $T_G$ of the particular liquid crystalline polymer used, the said polymer being processable by the thermoplastic method, to give a multilayer substrate. Before the pieces of film are printed and/or the single-layer substrates are bonded to form a multilayer substrate, the adhesion of the surfaces of these parts can be improved by etching by the ion beam or plasma process.

Subsequently, the integrated circuit is applied to the multilayer substrate produced using the said liquid crystalline polymers and is bonded firmly to it. The integrated circuit and the multilayer substrate are then connected electrically in a manner conforming to the circuit diagram.

Such a part consisting of an integrated circuit and a multilayer substrate, or a plurality of these parts, is then connected mechanically to the remaining components of the package via the multilayer substrate or substrates, and connected electrically in a manner conforming to the circuit diagram. The novel microelectronic component results, this component containing one ore more multilayer substrates produced using liquid crystalline polymers which can be processed by a thermoplastic method. The microelectronic component can then be covered by the method disclosed in EP-A-0 135 310.

To produce the novel thick-film hybrid circuits, substrates are first produced using the said liquid crystalline polymers.

For this purpose, the said polymers are converted, by injection molding or extrusion, to sheets or webs which, as such or after being cut to size, are calendered at right angles to the molding or extrusion direction. The stated methods are conventional polymer processing procedures which have no special features with regard to the method and whose process parameters can be determined by simple preliminary experiments. In general, such sheets or webs are about 0.5-1.5 mm thick after injection molding or extrusion. As a result of calendering, their thickness is reduced and is then in the region of the nip of the calender rolls. The sheets or webs are then divided into rectangular, preferably square, sheet sections of suitable dimensions, for example 2×2 inches, the edge regions of the sheets or webs being discarded. These sheet sections consisting of the said liquid crystalline polymers can then also be provided, in an appropriate manner, with holes conforming to the circuit diagram. These holes, which may be of different diameters, are subsequently used for holding plug contacts of electrical components and current sources.

The conductor paths conforming to the circuit diagram are applied to these sheet sections, in a thickness of in general from 5 to 25 $\mu$, by screen printing with metal pastes, and are baked by a suitable heat treatment, ie. fixed to the sheet sections. The substrates of the novel thick-film hybrid circuits result.

By incorporating electrical components which cannot be applied by the screen printing technique, e.g. external connections, diodes, transistors, nonlinear resistors, high-capacitance capacitors and/or microelectronic components, by soldering on or insertion into existing hole contacts, the novel thick-film hybrid circuits are completed.

Before being enclosed in a covering, these novel thick-film hybrid circuits whose substrates have been produced using liquid crystalline polymers which can be processed by a thermoplstic method are embedded in reactive resins, such as silicone resins, in a suitable manner or covered by the method disclosed in EP-A-No. 0 135 310.

The novel microelectronic components and the thick-film hybrid circuits according to the invention have many surprising advantages over the prior art component. For example, their signal velocity is substantially higher and their rate of transient errors substantially lower, and their ability to function is not adversely affected even by large temperature fluctuations. They can be produced simply and rapidly, the rejection rate being very low, and their essential components based on the said liquid crystalline polymers need not be postcured and show no tendency to distortion. Furthermore, these components are sufficiently heat-stable to withstand, without damage, the temperatures of the soldering baths for the periods required for the soldering processes. The fact that the metal pastes can be baked at comparatively low temperatures is a particular advantage.

EXAMPLES

EXAMPLE 1

Production of thick-film hybrid circuits (a) Preparation of a fully aromatic liquid crystalline polyester which can be processed by a thermoplastic method.

Method of preparation:

2.75 kg ($\hat{=}$ 25 moles) of hydroquinone, 4.65 kg ($\hat{=}$ 35 moles) of 4,4'-dihydroxybiphenyl, 8 kg ($\hat{=}$ 50 moles) of 2,7-dihydroxynahthalene, 17.25 kg ($\hat{=}$ 125 moles) of 4-hydroxybenzoic acid, 16.6 kg ($\hat{=}$ 100 moles) of terephthalic acid and 87.72 kg ($\hat{=}$ 860 moles) of acetic anhydride were stirred under a nitrogen atmosphere for 30 minutes at 130° C. and then heated to 150° C. The temperature was then increased to 290° C. in the course of 2.3 hours. 93 kg os distillate were obtained during this procedure.

The pressure was then reduced to 5 mbar at 290° C. over a period of 55 minutes, after which stirring was continued for a further 45 minutes at this temperature. A highly viscous filament-forming melt was obtained. The polyester melt and the cold polyester had a gloss resembling mother of pearl. The glass transition temperature $T_G$ was determined by differential scanning calorimetry (DSC) and was 121° C. The intrinsic viscosity [n] of the polyester after storage for 14 hours at 200° C. and under 20 mbar was 3.5 dl/g (measured on a 0.1% strength by weight solution in pentafluorophenol at 60° C.). At 290° C., the polyester exhibited liquid crystalline properties under the polarization microscope.

(b) Production of the circuits using the polyester

The polyester was melted in an extruder at 300° C. and extruded through a slot die to give a web 1.25 mm thick and 400 mm wide. This web was cut into square sheets measuring 400×400 mm and these were then calendered, at right angles to the original extrusion direction, at a roll temperature of 170°-180° C., a nip of 0.5 mm and a feed rate of 25 mm/sec. The calendered 0.62 mm thick sheets were sawed into sheet sections measuring 2×2 inches, the edge strips of the calendered sheets, to a width of about 5 cm each in the calendering direction and to a width of about 10 cm each in the original extrusion direction being discarded.

The sheet sections were provided with the necessary holes and printed with conductor paths of silver paste (90% of silver powder in epoxy resin) in a precision screen printing machine. The conductor paths were then fixed at 200° C.

Further electrical components and the connecting contacts were inserted or soldered on these substrates, in particular the microelectronic components produced according to Example 2 being used. The novel thick-film hybrid circuits thus obtained were then subjected to an electrical function test. This showed that, compared with conventional circuits, circuits according to the invention have a particularly low rate of transient errors and an extremely high signal velocity. Furthermore, they showed no tendency to distortion, and temperature fluctuations had no effect on their ability to function.

EXAMPLE 2

Production of a microelectronic component

The polyester prepared as described in Example 1a was melted at 320° C. in an extruder and extruded via a film blowing head having an annular die of 127 mm diameter and gap of 0.6 mm. The take-off rate was 5 m/minute and the melt throughput was 44 kg/h. The air feed was controlled so that the resulting blow-up ratio was 1:2.5. The wall thickness of the resulting tubular film was 0.04 mm.

Square pieces of film having an edge length of 5 cm were punched out from this tubular film. The pieces of film were provided with the holes of 150 $\mu$m diameter which were required by the circuit diagram and subsequently carried the electrically conductive connections to adjacent layers within a multilayer substrate. The conductor paths were then applied by precision screen printing using silver paste (90% of silver powder in epoxy resin), the printed conductor paths on the resulting single-layer substrates being 75 $\mu$m wide and 5 $\mu$thick. The end points of the conductor paths of the lowermost single-layer substrate were then connected, from the rear of the said substrate, to fine connecting wires, ie. connection lugs.

In accordance with the overall circuit diagram of the multilayer substrates, twenty differently printed single-layer substrates were placed in a frame for exact alignmnet and bonded to one another to form multilayer substrates in a press at 230° C. and under 25 kp/cm$^2$ in the course of 20 minutes, and the binder (epoxy resin) of the silver paste from which the conductor paths were prepared cured.

The electrical function test showed that all multilayer substrates produced in this manner were fully functional, ie. the substrates exhibited neither short circuits nor damage to the connecting wires.

Integrated circuits were subsequently applied to these multilayer substrates. After the electrical function test, which indicated a substantially higher signal velocity compared with the prior art and a substantially lower rate of transient errors, the components consisting of the integrated circuit and the multilayer substrate were mechanically connected to the remainder of the package via the multilayer substrates and electrically connected. The microelectronic components according to the invention resulted.

When these components were subjected to an electrical function test, it was found that the rejection rate in this simple and rapid production procedure was well below that of prior art processes, the novel components having a far superior signal velocity and substantially lower rate of transient errors compared with conventional components. Even large temperature fluctuations had no effect on their ability to function.

We claim:

1. A microelectronic component containing multilayer substrates, wherein the multilayer substrates are produced using a liquid crystalline thermoplastic polymer which, in the form of a melt, has anisotropic optical properties.

2. A microelectronic component as claimed in claim 1, wherein the multilayer substrates in the microelectronic component are produced using a substantially linear or nearly linear liquid crystalline fully aromatic polyester.

3. A microelectronic component as claimed in claim 1, wherein the liquid crystalline thermoplastic polymer contains from 10 to 70% by weight, based on the amount of the polymer, of finely divided, homogeneously dispersed, inorganic filler.

4. A microelectronic component as claimed in claim 2, wherein the substantially linear or nearly linear liquid crystalline fully aromatic polyester contain from 10 to 70% by weight, based on the amount of the polyester, of finely divided, homogeneously dispersed, inorganic fillers.

5. A thick-film hybrid circuit which carries, as an active electric component, a microelectronic component containing multilayer substrates wherein the multilayer substrates are produced using a liquid crystalline thermoplastic polymer which, in the form of a melt, has anisotropic optical properties.

* * * * *